United States Patent
Yamada et al.

(10) Patent No.: US 7,208,387 B2
(45) Date of Patent: Apr. 24, 2007

(54) METHOD FOR MANUFACTURING COMPOUND SEMICONDUCTOR WAFER AND COMPOUND SEMICONDUCTOR DEVICE

(75) Inventors: Hisashi Yamada, Tsukuba (JP); Noboru Fukuhara, Tsukuba (JP)

(73) Assignees: Sumitomo Chemical Company, Limited, Tokyo (JP); Sumika Epi Solution Company, Ltd., Tokyo (JP)

( * ) Notice: Subject to any disclaimer, the term of this patent is extended or adjusted under 35 U.S.C. 154(b) by 0 days.

(21) Appl. No.: 10/524,013

(22) PCT Filed: Aug. 1, 2003

(86) PCT No.: PCT/JP03/09818

§ 371 (c)(1),
(2), (4) Date: Feb. 8, 2005

(87) PCT Pub. No.: WO2004/015781

PCT Pub. Date: Feb. 19, 2004

(65) Prior Publication Data

US 2006/0001044 A1    Jan. 5, 2006

(30) Foreign Application Priority Data

Aug. 9, 2002    (JP)    ............................. 2002-233708

(51) Int. Cl.
*H01L 21/331*    (2006.01)

(52) U.S. Cl. .................. 438/343; 438/312; 438/317; 257/E29.03; 257/E29.114

(58) Field of Classification Search ............... 438/312, 438/317, 343, FOR. 165; 257/E29.03, E29.114
See application file for complete search history.

(56) References Cited

U.S. PATENT DOCUMENTS

2001/0026971 A1 * 10/2001 Fujita et al. ................ 438/235
2002/0163014 A1 * 11/2002 Welser et al. ............... 257/197

FOREIGN PATENT DOCUMENTS

| EP | 390552 A2 | 10/1990 |
| EP | 977245 A2 | 2/2000 |
| JP | 57-92526 A | 6/1982 |
| JP | 3-110829 A | 5/1991 |
| JP | 6-236852 A | 8/1994 |

* cited by examiner

*Primary Examiner*—Michelle Estrada
(74) *Attorney, Agent, or Firm*—Birch, Stewart, Kolasch & Birch, LLP

(57) ABSTRACT

A method for producing a compound semiconductor wafer used for production of HBT by vapor growth of a sub-collector layer, a collector layer, a base layer and an emitter layer in this turn on a compound semiconductor substrate using MOCVD method wherein the base layer is grown as a p-type compound semiconductor thin film layer containing at least one of Ga, Al and In as a Group III element and As as a Group V element under such growth conditions that the growth rate gives a growth determined by a Group V gas flow rate-feed.

4 Claims, 7 Drawing Sheets

METHOD FOR MANUFACTURING COMPOUND SEMICONDUCTOR WAFER AND COMPOUND SEMICONDUCTOR DEVICE

TECHNICAL FIELD

The present invention relates to a method for producing a compound semiconductor wafer used for production of hetero junction bi-polar transistors (HBTs), and to a compound semiconductor device.

BACKGROUND ART

Hetero junction bi-polar transistors (HBTs) are bi-polar transistors in which an emitter-base junction is a hetero junction using a material greater in band gap than a base layer for an emitter layer in order to enhance the emitter injection efficiency, and since HBT is suitable as semiconductor devices used in the frequency area higher than microwave band, they are expected to be used as semiconductor devices for portable telephones of the next generation.

The structure of HBT is as follows. In the case of, for example, a GaAs-based HBT, generally an $n^+$-GaAs layer (sub-collector layer), an n-GaAs layer (collector layer), a p-GaAs layer (base layer), an n-InGaP layer (emitter layer) and an n-GaAs layer (sub-emitter layer) are in turn grown as crystal on a semi-insulated GaAs substrate by a Metal Organic Chemical Vapor Deposition (MOCVD), thereby forming a thin film crystal wafer having the above-mentioned layer structure where a pn junction which is an emitter-base junction is of a structure of a hetero junction, and an HBT is produced using the resulting wafer.

FIG. 7 schematically shows a structure of the conventional general GaAs-based HBT. In the HBT 100 of FIG. 7, a sub-collector layer 102 comprising an $n^+$-GaAs layer, a collector layer 103 comprising an n-GaAs layer, a base layer 104 comprising a p-GaAs layer, an emitter layer 105 comprising an n-InGaP layer, a sub-emitter layer 106 comprising an $n^+$-GaAs layer and an emitter contact layer 107 comprising an $n^+$-InGaAs layer are in this turn formed as semiconductor thin film crystal layers on a semi-insulated GaAs substrate 101 by a suitable vapor growth method such as MOCVD method, and a collector electrode 108, a base electrode 109 and an emitter electrode 110 are formed on the sub-collector layer 102, the base layer 104 and the emitter contact layer 107, respectively.

In an HBT constructed as above, the current gain β is shown by $\beta=Ic/Ib=(In-Ir)/(Ip+Is+Ir)$, wherein In denotes an electron injection current from emitter to base, Ip denotes a hole injection current from base to emitter, Is denotes an emitter/base interface recombination current, and Ir denotes a recombination current in the base.

Therefore, it can be seen from the above formula that in order to increase the current gain β, it is necessary to decrease Ir which is a recombination current in the base. This recombination current in the base is sensitive to the crystallinity of the base layer, and when there are many crystal defects in the base layer, the recombination current in the base increases, resulting in decrease of the current gain β. Thus, in order to improve characteristics of current gain of HBT, it is necessary to make the base layer have a good crystallinity.

As one of the conventional technologies to attain the above object, JP-A-3-110829 proposes a method for producing a compound semiconductor thin film in which the substrate temperature during the growth of the compound semiconductor thin film is set in the range of 450–650° C. and the feeding molar ratio of the raw material of Group V and that of Group III is set in the range of 0.3–2.5.

According to the above proposed conventional method, it is disclosed that the carrier concentration can be controlled to $1\times10^{18}$ cm$^{-3}$–$1\times10^{20}$ cm$^{-3}$, but the method has a problem that when the feeding molar ratio of the raw material of Group V and that of Group III and the growth temperature are determined, the carrier concentration is determined thereby and thus it is difficult to control the carrier concentration to a desired value.

DISCLOSURE OF INVENTION

The object of the present invention is to provide a method for producing a compound semiconductor wafer and a compound semiconductor device which can solve the above problems in the conventional technologies.

The object of the present invention is to provide a method for producing a compound semiconductor wafer where control of carrier concentration becomes possible by externally adding impurities, whereby a base layer of good crystallinity can be formed, and to provide a compound semiconductor device using the wafer.

For the purpose of solving the above problems, the present invention is employed under such conditions as giving a growth determined by a Group V gas flow rate-feed as the growth conditions of the base layer, and thus the crystallinity of the base layer is improved and the current gain can be remarkably improved. By setting the V/III ratio in the range of 1.0–0.3, the growth of the base layer can be a growth determined by a Group V gas flow rate-feed.

The V/III ratio here is a feed ratio of the raw material of Group V and that of Group III during the growth of Groups III–V compound semiconductor crystals. In the organic metal vapor growth method, the raw materials are generally fed in the state of gas from gas cylinders or bubblers. The feed rate of gas from a gas cylinder is controlled by a flow rate controlling apparatus such as a mass flow controller located on a feeding line, and (gas concentration in cylinder)×(gas flow rate) is an actual flow rate of the raw material. The feed rate of gas from a bubbler is controlled by a flow rate controlling apparatus such as a mass flow controller located on a feeding line of carrier gas flowed to the bubbler, and (carrier gas flow rate)×(vapor pressure of raw material in bubbler)/(inner pressure of bubbler) is an actual flow rate of the raw material. The ratio of feed rate of the raw material of Group V and that of Group III on the actual flow rates of the raw materials fed by the above systems is generally called V/III ratio. In this specification, the term "V/III ratio" is also used according to this definition.

The first embodiment of the present invention proposes a method for producing a compound semiconductor wafer used for the production of HBT by vapor growth of a sub-collector layer, a collector layer, a base layer and an emitter layer in this turn on a compound semiconductor substrate using MOCVD method, wherein the base layer is a p-type compound semiconductor thin film layer containing at least one of Ga, Al and In as a Group III element and as a Group V element and is grown under such conditions that the growth rate gives a growth determined by a Group V gas flow rate-feed.

By selecting the growth conditions of the base layer as mentioned above, crystallinity of the grown base layer is improved, the recombination current in the base layer can be decreased, and the current gain of HBT can be increased.

The second embodiment of the present invention proposes a method for producing a compound semiconductor wafer according to the invention of claim 1, wherein the base layer is grown with the V/III ratio being in the range of 0.3–1.0.

The third embodiment of the present invention proposes a method for producing a compound semiconductor wafer according to the invention of claim 1 or 2, wherein the adjustment of carrier concentration in the base layer is controlled by the flow rate of methane halide.

The fourth embodiment of the present invention proposes a method for producing a compound semiconductor wafer according to the invention of claim 1 or 2, wherein the adjustment of carrier concentration in the base layer is controlled by the flow rate of $CBrCl_3$.

The fifth embodiment of the present invention proposes a compound semiconductor device comprising a sub-collector layer, a collector layer, a base layer and an emitter layer formed as thin film crystal layers in this turn on a compound semiconductor substrate by vapor growth, wherein the life time of minority carriers in the base layer is 200 psec or longer.

The sixth embodiment of the present invention proposes a compound semiconductor device containing a hetero junction bi-polar transistor and comprising a sub-collector layer, a collector layer, a base layer and an emitter layer formed as thin film crystal layers in this turn on a compound semiconductor substrate by vapor growth, wherein the ratio of current gain/base sheet resistance of the hetero junction bi-polar transistor is 0.60 or more.

BEST MODE FOR CARRYING OUT THE INVENTION

Figure 1:
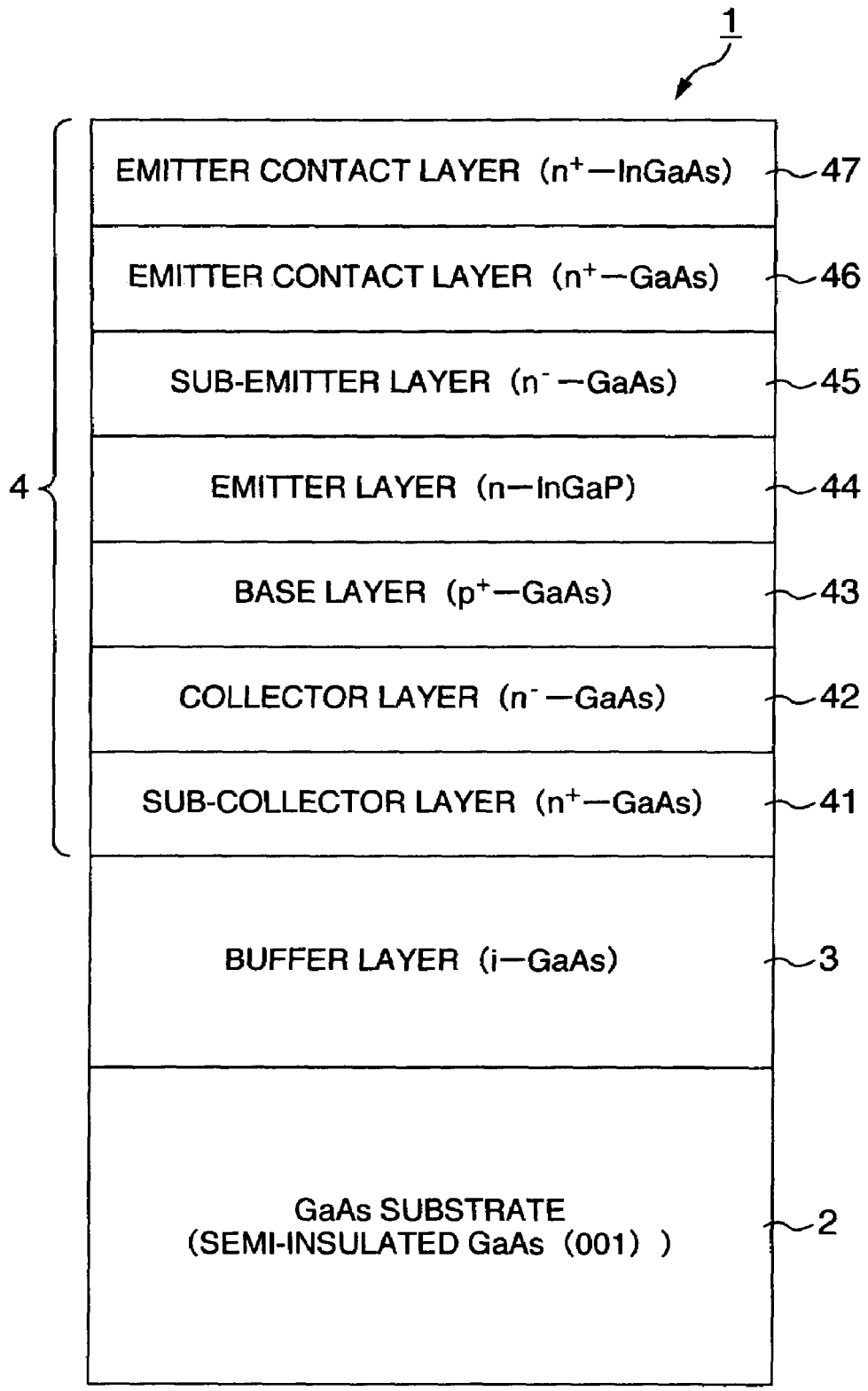
FIG. 1 schematically shows a layer structure of one example of the thin film crystal wafer for HBT which is produced by the method of the present invention.

One example of the embodiments according to the present invention will be explained below referring to the drawings.

FIG. 1 schematically shows a layer structure of one example of the thin film crystal wafer for HBT which is produced by the method of the present invention. This thin film crystal wafer is a compound semiconductor wafer used for producing a GaAs-based HBT, and one example of the embodiments of producing the semiconductor wafer having the layer structure shown in FIG. 1 by the method of the present invention will be explained below. Accordingly, this example should not be construed as limiting the method of the present invention to only the production of the compound semiconductor wafer having the structure as shown in FIG. 1.

The semiconductor wafer 1 shown in FIG. 1 has the following structure. The semiconductor wafer 1 is constructed by in this turn laminating a plurality of semiconductor thin film crystal growth layers on a GaAs substrate 2 comprising semi-insulated GaAs compound semiconductor crystals by MOCVD method. The semiconductor wafer 1 will be explained referring to FIG. 1. The GaAs substrate 2 comprises a semi-insulated GaAs (001) layer, and a buffer layer 3 comprising an i-GaAs layer is formed on the GaAs substrate 2.

Next, construction of HBT functional layers 4 formed on the buffer layer 3 will be explained. The HBT functional layers 4 include an $n^+$-GaAs layer acting as a sub-collector layer 41 and an $n^-$-GaAs layer acting as a collector layer 42 which are in this turn formed as semiconductor epitaxial growth crystal layers of a given thickness on the buffer layer 3. A $p^+$-GaAs layer acting as a base layer 43 is formed on the collector layer 42 similarly as a semiconductor epitaxial growth crystal layer, and an n-InGaP layer acting as an emitter layer 44 is formed on the base layer 43. An $n^-$-GaAs layer is formed on the emitter layer 44 as a sub-emitter layer 45, and an $n^+$-GaAs layer and an $n^+$-InGaAs layer as emitter contact layers 46 and 47.

A method for forming the above-mentioned respective layers as epitaxial growth semiconductor thin film crystal layers by MOCVD method will be explained in detail below.

Figure 2:
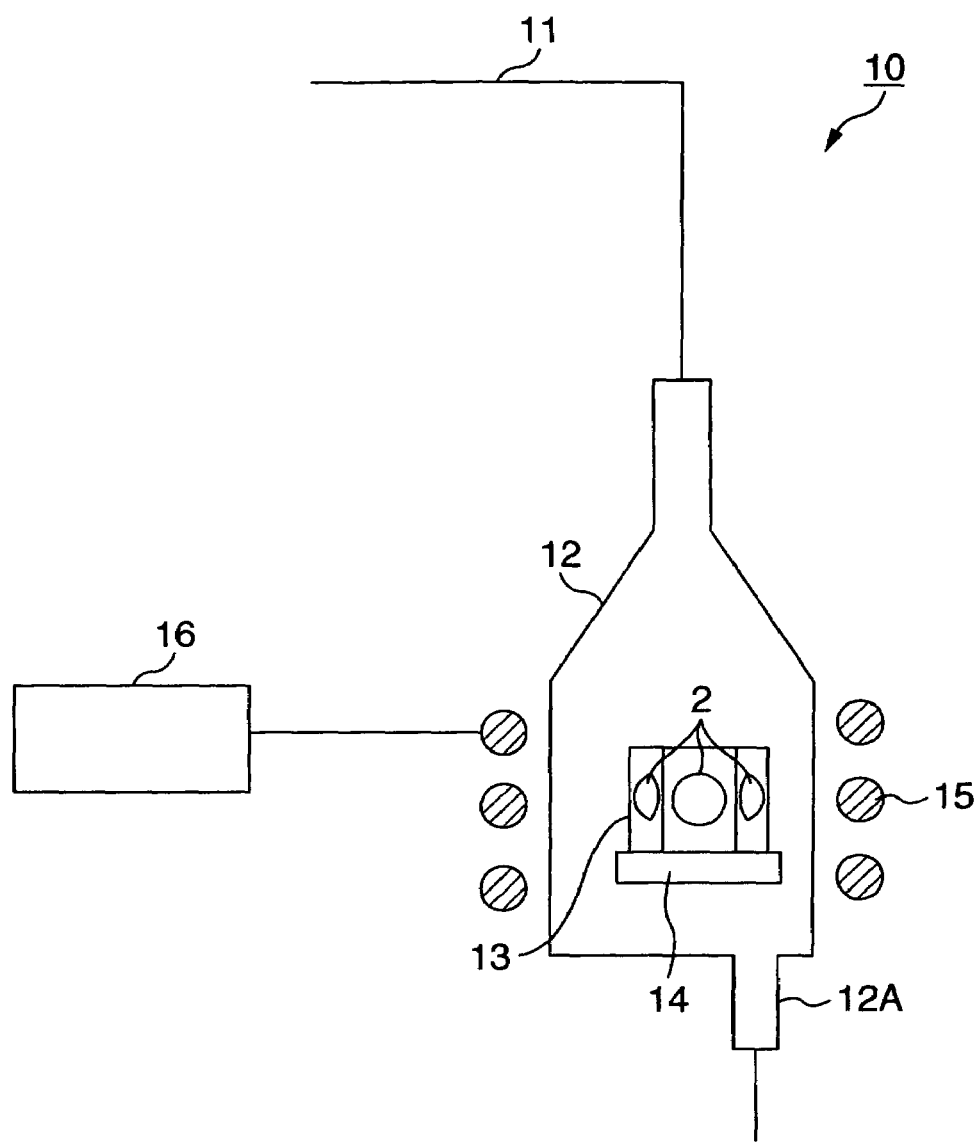
FIG. 2 diagrammatically shows the principal parts of a vapor growth semiconductor production apparatus used for producing the semiconductor wafer shown in FIG. 1.

FIG. 2 diagrammatically shows the principal parts of a vapor growth semiconductor production apparatus 10 used for producing the semiconductor wafer 1 shown in FIG. 1 by MOCVD method. The vapor growth semiconductor production apparatus 10 has a reaction vessel 12 to which a raw material gas from a raw material feeding system (not shown) is fed through a raw material feeding line 11, and a susceptor 13 for heating the GaAs substrate 2 placed thereon is disposed in the reaction vessel 12. In this embodiment, the susceptor 13 has a shape of plyhedra, on the surface of which a plurality of the GaAs substrates 2 are provided, and the susceptor 13 has a known construction of being able to be rotated by a rotating apparatus 14. A coil for subjecting the susceptor 13 to radiofrequency induction heating is indicated by reference numeral 15. The GaAs substrates 2 can be heated to a given growth temperature by passing a heating current through the coil 15 from a heating electric source 16. By this heating, the raw material gas fed into the buffer layer 3 through the raw material feeding line 11 is heat decomposed on the GaAs substrate 2, whereby a desired semiconductor thin film crystal can be vapor grown on the GaAs substrate 2. The used gas is exteriorly discharged from an exhaust port 12A and fed to an exhaust gas disposal apparatus.

After the GaAs substrate 2 is placed on the susceptor 13 in the reaction vessel 12, GaAs is grown at 650° C. as buffer layer 3 of about 500 nm using hydrogen as a carrier gas and arsine and trimethylgallium (TMG) as raw materials. Thereafter, sub-collector layer 41 and collector layer 42 are grown on the buffer layer 3 at a growth temperature of 620° C.

Then, a base layer 43 is grown at a growth temperature of 620° C. on the collector layer 42 using trimethylgallium (TMG) as a raw material of Group III, arsine ($AsH_3$) as a raw material of Group V, and $CBrCl_3$ as a dopant for the formation of a p-type base layer. In this case, the base layer 43 is grown with the V/III ratio being within 0.3–1.0 so as to give a growth determined by a Group V gas flow rate-feed at the growth of base layer 43. If the V/III ratio is more than 1.0, the growth rate is determined by a Group III gas flow rate-feed, and if the V/III ratio is not more than 1.0, the growth rate is determined by a Group V gas flow rate-feed, and thus, with decrease of the V/III ratio, the growth rate decreases.

Figure 3:
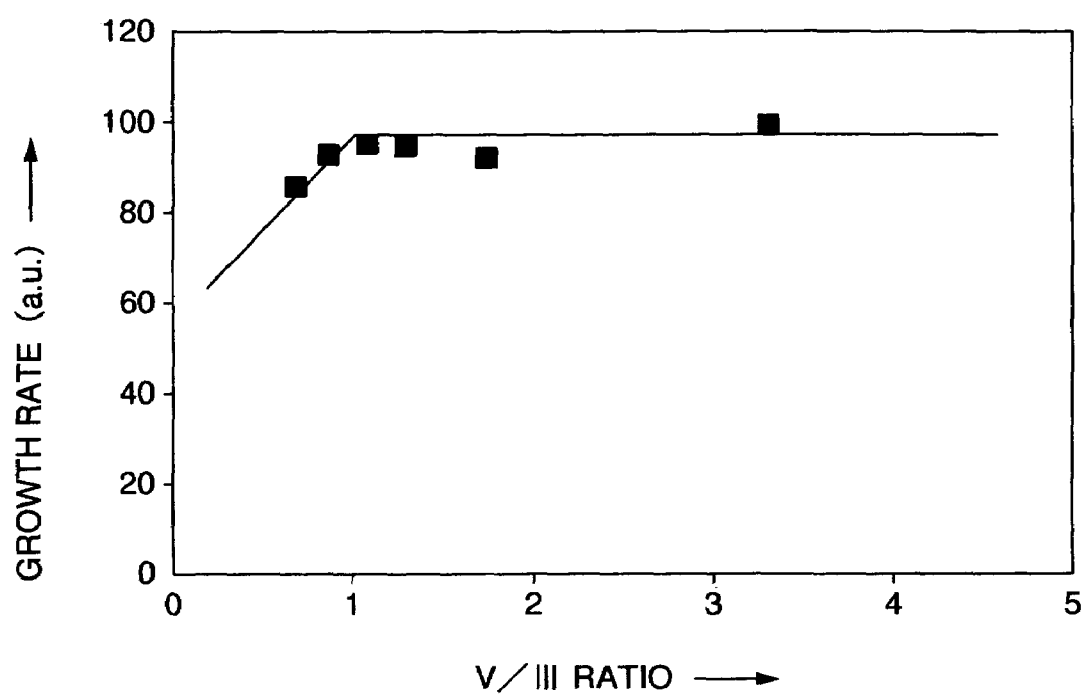
FIG. 3 is a graph which shows the relation between V/III ratio and growth rate of p-GaAs.

FIG. 3 shows a relation between the V/III ratio and the growth rate (a.u.) when the flow rate of the gas of Group III is constant and the flow rate of the gas of Group V is varied, and this FIG. 3 shows the facts explained above. In the area of the V/III ratio being more than 1.0, the growth rate is determined by the flow rate of the gas of Group III and hence it is constant. In the area of the V/III ratio being not more than 1.0, the growth rate is determined by the flow rate of the gas of Group V, and since the flow rate of the gas of Group V decreases with decrease of the V/III ratio, the growth rate decreases with decrease of the V/III ratio. If the V/III ratio is less than 0.3, flatness of crystals is deteriorated. Therefore, the use of a V/III ratio of less than 0.3 is unreal, and for the above reasons, the V/III ratio is preferably a suitable value in the range of 1.0–0.3.

After the base layer 43 is formed in this way, an emitter layer 44 and a sub-emitter layer 45 are grown on the base layer 43 at a growth temperature of 620° C., and emitter contact layers 46 and 47 are formed on the sub-emitter layer 45.

In the semiconductor wafer 1, since the base layer 43 constituting the HBT is grown with the V/III ratio being within 0.3–1.0 so as to give a growth determined by a Group V flow rate-feed, the crystallinity of the base layer 43 is remarkably improved, and hence the recombination current in the base layer can be made smaller and the current gain of HBT can be considerably improved.

In the above embodiment, TMG, namely, a Ga-based raw material is used as the raw material of Group III, but Al-based raw materials or In-based raw materials can also be used. The Ga-based raw materials, Al-based raw materials and In-based raw materials may be solely used, but they can also be used in combination of some of them. As the raw materials of Group V, in addition to arsine, other suitable raw materials of Group V containing As for growing of the base layer 43 may be used.

Since $CBrCl_3$ is used as a dopant to dope carbon (C) to form the base layer 43 of p-type, the doping amount of carbon (C) is adjusted by properly adjusting the flow rate of $CBrCl_3$ during the growing of the base layer 43, whereby the carrier concentration of the base layer 43 can be controlled independently of the growing conditions.

Figure 4:
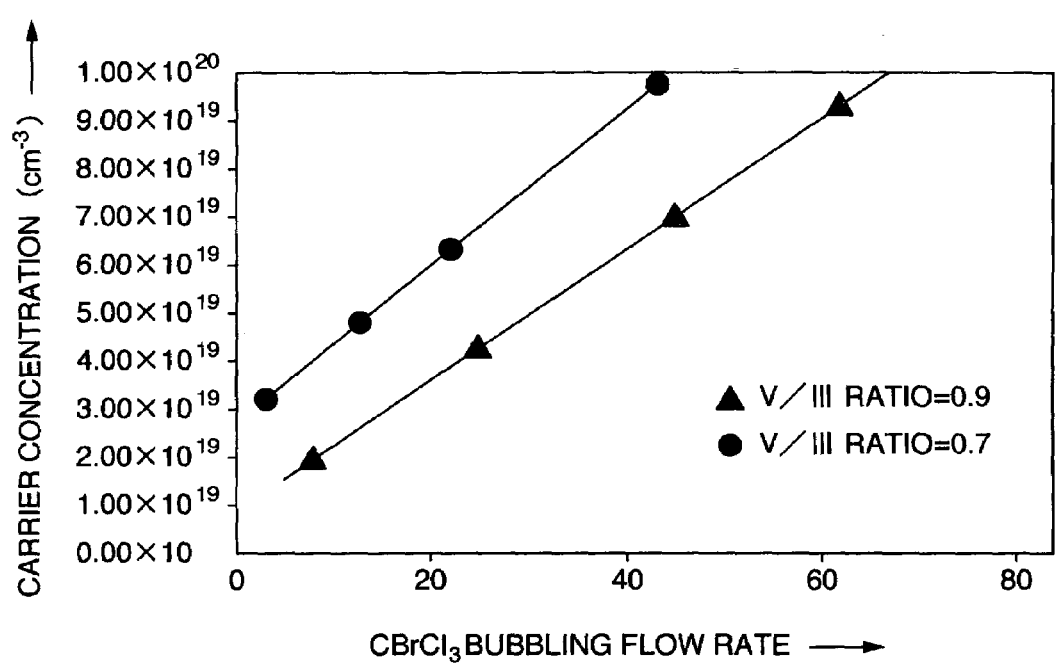
FIG. 4 is a graph which shows the relation between flow rate of $CBrCl_3$ and carrier concentration.

When the growth temperature is 620° C. and the V/III ratio is 0.9 or 0.7. It is realized that the carrier concentration can be independently controlled in the range of $1.0\times10^{19}$ cm$^{-3}$–$1.0\times10^{20}$ cm$^{-3}$ by adjusting the flow rate (sccm) of the carrier gas fed to a $CBrCl_3$ bubbler at a temperature of the dopant $CBrCl_3$ of 10° C. as shown in FIG. 4. The same may be said when the temperature is other than 620° C.

The control of the carrier concentration in the base layer 43 can also be similarly carried out by passing methane halide at the time of growing and controlling the flow rate thereof in addition to the adjustment of the flow rate of $CBrCl_3$. As the methane halide, for example, $CBr_4$, $CBr_3Cl$, $CBr_2Cl_2$, $CCl_4$ and the like can be used other than those above.

When a semiconductor wafer 1 having the layer construction shown in FIG. 1 is produced and HBT is produced using this semiconductor wafer 1 as mentioned above, crystallinity of the base layer 43 is improved and hence an amplification device of great current gain can be produced. In this case, it is desirable that the life time of minority carriers in the base layer 43 is 200 psec or longer. Furthermore, the ratio of current gain/base sheet resistance is preferably 0.60 or more.

A semiconductor wafer having the structure as shown in FIG. 1 was produced and an HBT device was produced using the semiconductor wafer as explained in the following examples. The emitter size was 100 μm×100 μm. Here, a collector current/base current ratio when a collector current of 1 kA/cm² was passed was used as current gain β.

The time-resolved PL measurement was impossible because film thickness of the base layer was thin in the HBT structure. Therefore, the measurement was conducted on a sample prepared by laminating a thin film of p-GaAs at 1 μm under the same conditions as in the production of the HBT base layer.

EXAMPLE 1

The growth conditions of base layer 43 were as follows. Growth temperature: 620° C.; raw material of Group III: trimethylgallium (TMG); raw material of Group V: arsine ($AsH_3$); dopant for forming p-type base layer: $CBrCl_3$; and V/III ratio: 0.9. Under the above growth conditions, the carrier concentration of the base layer 43 of $3.6\times10^{19}$ cm$^{-3}$ was obtained by adjusting the doping amount of C as a dopant. The current gain β of the HBT device in this case was measured to obtain 180. Further, a ratio of current gain β/base sheet resistance BRs was measured to obtain 0.60.

EXAMPLE 2

An HBT device was produced under the same conditions as in Example 1, except that the V/III ratio was 0.7, and the current gain β of the HBT device was measured to obtain 215. Further, the life time of minority carriers in the base layer 43 was measured to obtain 230 psec. The ratio of current gain β/base sheet resistance BRs was measured to obtain 0.70.

COMPARATIVE EXAMPLE

HBT devices for comparison were produced under the same growth conditions as in Example 1, except that the V/III ratio was 1.3, 3.3 or 25 which was more than 1.0.

When the V/III ratio was more than 1.0, the current gains β were all 150. Furthermore, The ratio of current gain β/base sheet resistance BRs was measured to obtain 0.50. The life time of minority carriers in the case of the V/III ratio being 25 was measured to obtain 160 psec.

Figure 5:
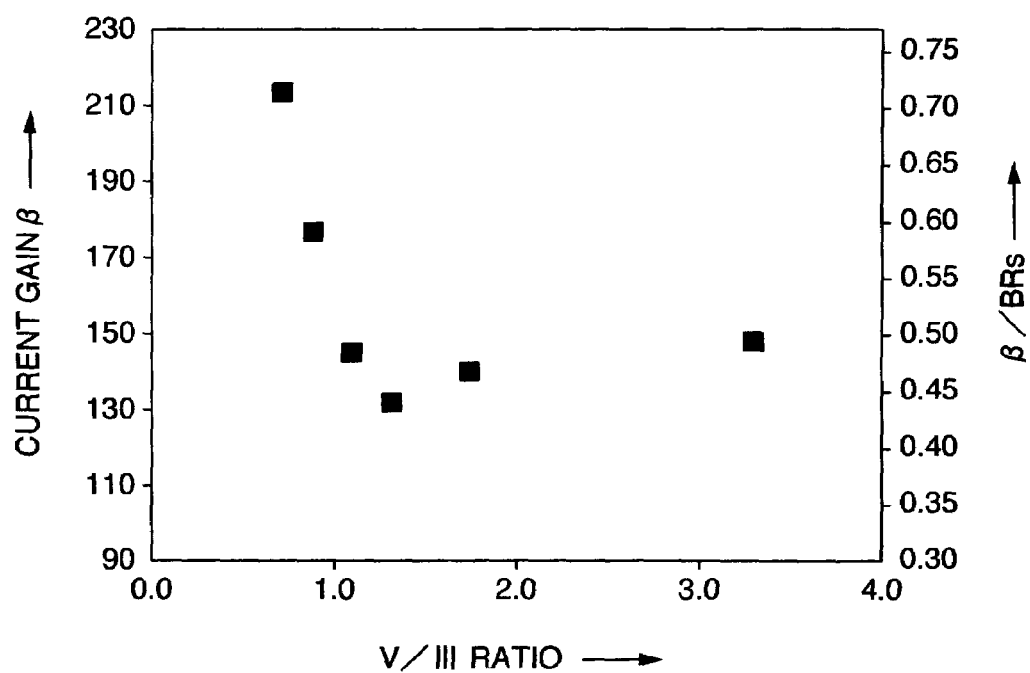
FIG. 5 is a graph which shows the relation between V/III ratio and current gain in the base layer.
Figure 6:
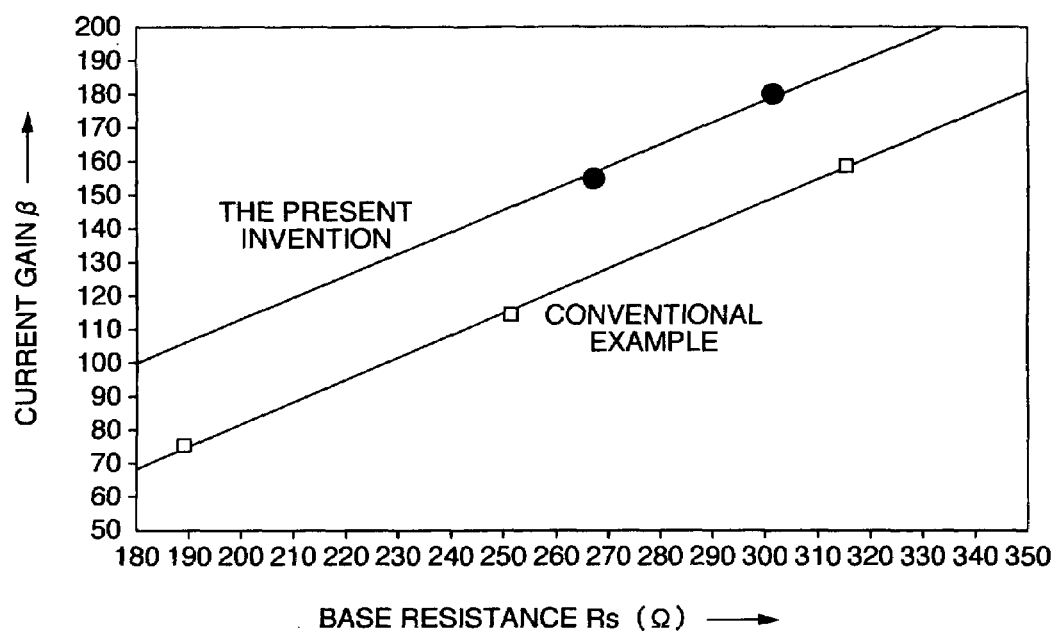
FIG. 6 is a graph which shows the relation between current gain and base resistance in the present invention in comparison with that of a conventional example.
Figure 7:
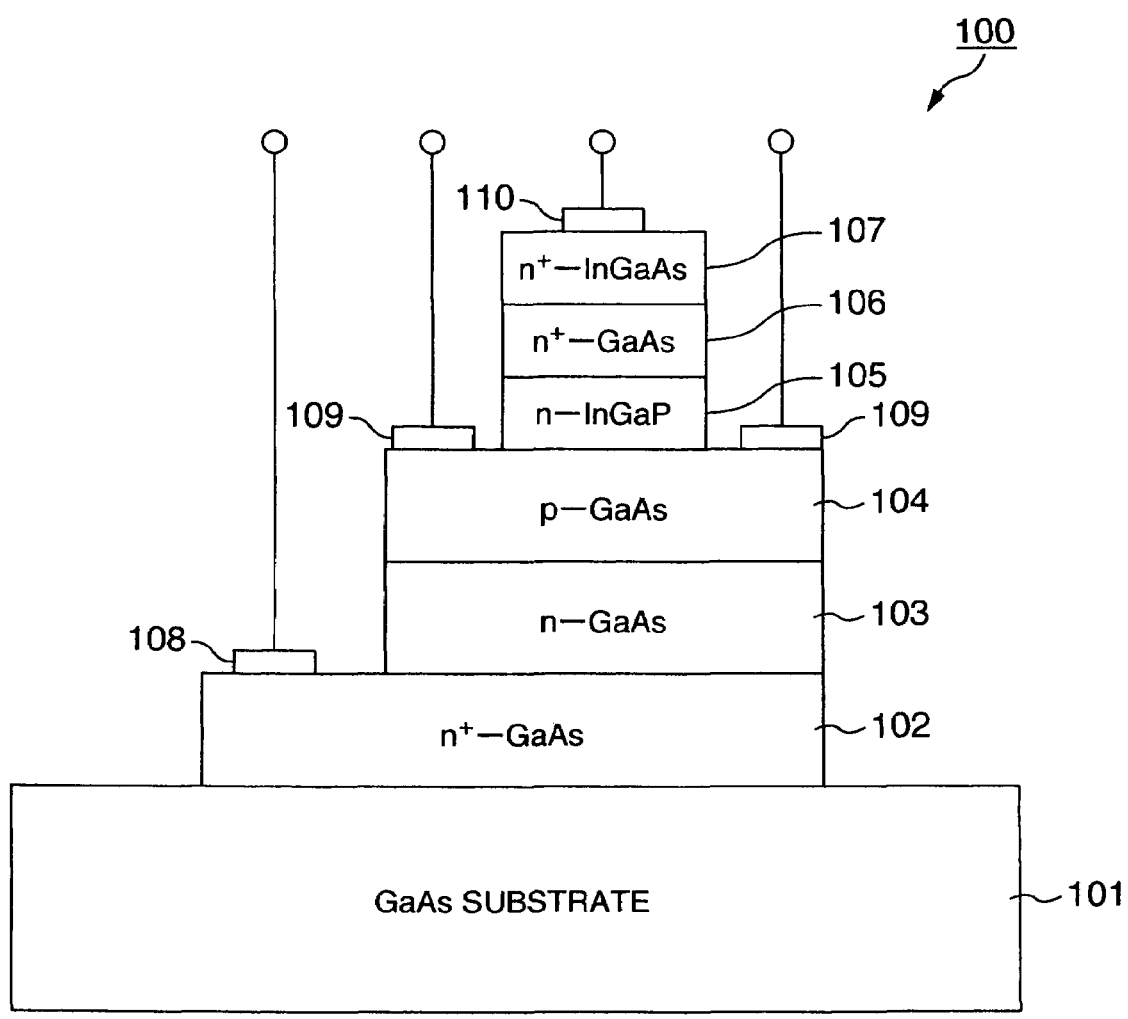
FIG. 7 schematically shows a layer structure of a general GaAs-based HBT in conventional technologies.

FIG. 5 and FIG. 6 show the results of the measurements. Under such conditions as giving a growth determined by Group V gas flow rate-feed where the V/III ratio was not more than 1.0, the life time of minority carriers in the base layer was prolonged because of good crystalline quality. It is considered that for this reason, β was improved.

The V/III ratio, ratio of current gain β/base sheet resistance BRs and life time τ of minority carriers in Examples 1 and 2 and Comparative Example are as shown below.

|  | V/III ratio | β/BRs | τ (ps) |
| --- | --- | --- | --- |
| Comparative Example | 25 | 0.50 | 160 |
| Example 1 | 0.9 | 0.60 | 200 |
| Example 2 | 0.7 | 0.70 | 230 |

According to the present invention, when the growth conditions of the base layer are those which give a growth determined by a Group V gas flow rate-feed, crystallinity of the base layer can be improved, life time of minority carriers can be prolonged, and, furthermore, current gain can be markedly improved by using a high ratio of current gain β/base sheet resistance BRs. Moreover, since the carrier concentration of the base layer can be controlled independently of the growth conditions, the carrier concentration can be easily controlled to the desired value.

INDUSTRIAL APPLICABILITY

Devices using the compound semiconductor wafer of the present invention are used as HBT in the frequency area higher than microwave band.

The invention claimed is:

1. A method for producing a compound semiconductor wafer used for production of HBT by vapor growth of a sub-collector layer, a collector layer, a base layer and an emitter layer in this order on a compound semiconductor substrate using MOCVD method wherein the base layer is a p-type compound semiconductor thin film layer containing at least one of Ga, Al and In as a Group III element and As as a Group V element and is grown under such conditions that the growth rate gives a growth determined by a Group V gas flow rate-feed, wherein the adjustment of carrier concentration in the base layer is controlled by the flow rate of methane halide.

2. A method according to claim 1, wherein the base layer is grown with the V/III ratio being within the range of 0.3–1.0.

3. A method according to claim 1 or 2, wherein the adjustment of carrier concentration in the base layer is controlled by the flow rate of $CBrCl_3$.

4. A method according to claim 1, wherein the base layer is grown with the V/III ratio being within the range of 0.7–1.0.

* * * * *